United States Patent [19]

Shimizu et al.

[11] Patent Number: 5,709,139
[45] Date of Patent: Jan. 20, 1998

[54] PUNCHING APPARATUS FOR MOVING A PUNCHING UNIT IN A CIRCUMFERENTIAL DIRECTION OF A CYLINDRICAL INNER SURFACE SCANNER

[75] Inventors: Yoshio Shimizu; Touru Kawata; Hiroshi Nomoto, all of Kyoto, Japan

[73] Assignee: Dainippon Screen Mfg. Co., Ltd., Japan

[21] Appl. No.: 387,063

[22] Filed: Feb. 10, 1995

[30] Foreign Application Priority Data

Feb. 10, 1994 [JP] Japan ................. 6-037732

[51] Int. Cl.$^6$ ............................................. B26F 1/08
[52] U.S. Cl. ................................. 83/54; 83/184; 83/185; 83/191; 83/948; 346/33 R; 346/138
[58] Field of Search .................... 346/33 R, 138, 346/146; 83/948, 949, 184, 185, 191, 54

[56] References Cited

U.S. PATENT DOCUMENTS

| | | | |
|---|---|---|---|
| 3,689,932 | 9/1972 | Gerber | 346/29 |
| 4,260,998 | 4/1981 | Fukui | 346/138 X |
| 4,437,371 | 3/1984 | Howerton et al. | 83/54 |
| 4,500,285 | 2/1985 | Klotmann et al. | 432/103 |
| 4,637,710 | 1/1987 | Fujii et al. | 346/138 X |
| 4,723,134 | 2/1988 | Morita et al. | 346/138 |

FOREIGN PATENT DOCUMENTS

| | | |
|---|---|---|
| 5-5846 | 1/1993 | Japan. |
| 5-27190 | 2/1993 | Japan. |

*Primary Examiner*—Rinaldi I. Rada
*Assistant Examiner*—Elizabeth Stanley
*Attorney, Agent, or Firm*—Ostrolenk,Faber,Gerb & Soffen,LLP

[57] ABSTRACT

A photosensitive material is mounted onto an inner surface of a cylindrical inner surface drum. An input signal which provides the size of the photosensitive material is supplied to a controller. As the controller drives a pulse motor under the control of a control signal, a moving part with which punching units are connected is moved in a circumferential direction of the drum by means of the pulse motor and positioned at the desired positions for punching. Then only two punching units, determined by the controller in accordance with the size of the photosensitive material, are driven to punch holes in the photosensitive material.

15 Claims, 11 Drawing Sheets

PUNCHING APPARATUS FOR MOVING A PUNCHING UNIT IN A CIRCUMFERENTIAL DIRECTION OF A CYLINDRICAL INNER SURFACE SCANNER

BACKGROUND OF THE INVENTION

1. Field of the Invention

The present invention relates to a punching apparatus which is used in a cylindrical inner surface scanner which comprises a cylindrical inner surface drum to punch a hole in a photosensitive material. It also relates to a method of punching holes in a photosensitive material which is mounted on the scanner.

2. Description of the Background Art

A cylindrical inner surface scanner comprises a cylindrical inner surface drum, a photosensitive material (such as a film, a plate material and a photographic printing paper) which is mounted on the drum by vacuum suction force, a scanning head which moves along a central axis of the drum in a subscanning direction, a main scanning deflector which is disposed in the scanning head and which rotates about the central axis of the drum, and an imaging lens which is also disposed in the scanning head. In a cylindrical inner surface scanner, an optical beam modulated by an image signal is deflected by the deflector through the lens and swept upon the photosensitive material in a main scanning direction while moving the scanning head in the subscanning direction. Details of a structure of such a cylindrical inner surface scanner is disclosed in Japanese Patent Laid-Open Gazette Nos. 5-27190 and 5-5846, for instance. In recent years, cylindrical inner surface scanners are applied to a direct platemaking system known as Computer To Plate or CTP. The CTP is an apparatus for manufacturing a printing plate by forming a half-tone dot image directly on a plate material in accordance with a digital image data signal in which a character, a graphic, a picture and the like are integrated, without forming a half-tone dot film. Thus, a photosensitive material used in CTP platemaking is a plate material, usually a presensitized plate (PS plate). A PS plate is obtained by coating a plate material such as an aluminum plate, a plastic sheet and a paper with photosensitive fluid advance. Some PS plates are sensitive to visible light having a wavelength of 488 nm, for example, while some other PS plates are sensitive to infrared light for the purpose of exposing a laser diode (LD) and etc.

At present, mounting of such a photosensitive material on an inner surface of a cylindrical drum is manually performed by an operator. An operator places a photosensitive material in the drum by hand. Thereafter, the photosensitive material is held on the inner surface of the drum by vacuum suction force and exposed upon mounting.

After exposing, holes must be punched in the photosensitive material. This is because a subsequent printing process uses a printer in which a printing plate (i.e., the photosensitive material as it is after exposed) is registered using a pin system. The pin holes need be formed in the photosensitive material prior to printing. Punching of the pin holes is conventionally performed using a punching unit. That is, a groove is formed in the inner surface of the cylindrical inner surface drum at one end, and a plurality of mutually independent punching units are fitted into the groove at certain intervals. Due to this, in mounting the photosensitive material, the photosensitive material must be inserted in the drum in such a manner that a center line of the photosensitive material is always aligned to a middle position between the punching units. Of course, an end of the photosensitive material must be placed in a space between punches and dices of the punching units.

FIG. 10 is a plan view of an inner surface 11 of the cylindrical inner surface drum 1. Two punching units 63 and 64 are fixed to the inner surface 11 near one end of the inner surface 11 at a pitch 2d (from a center of one punching unit to a center of another). A photosensitive material 65 of a certain size is placed and mounted by suction force on the inner surface 11 so that a center line 69 of the photosensitive material 65 is a distance d away from each of the two punching units 63 and 64. A fitting groove is omitted in FIG. 10 for clarity of illustration.

In this conventional technique, therefore, it is always possible to form pin holes which are each a predetermined distance away from the center line 69 of the photosensitive material 65. For convenience of reference, the conventional punching method as above will be referred to as "center line punching."

Center line punching is effective is photosensitive materials are always of the same size. However, the reality is that photosensitive materials that are used are never of the same size.

As for PS plates, for instance, their size varies from a minimum of 550 mm×650 mm to a maximum of 820 mm×1030 mm. Films also vary in size including various A-type sheets, such as A1 sheets and A2 sheets. Hence, in punching holes by the conventional center line punching method, it is necessary to adjust the position of the photosensitive material depending on its size.

Since a stopper is disposed in the inner surface 11 in most cases for the purpose of mounting and positioning a photosensitive material 65 in the conventional method, as many stoppers as the number of the sizes of photosensitive materials 65 need be disposed on the inner surface 11, as shown in FIG. 10. In FIG. 10, holes 74 can be punched in a photosensitive material 65 of a certain size by center line punching using a stopper 66. However, for a larger photosensitive material 67, the stopper 66 must be detached and a new stopper 68 must be set. Considering that PS plates and films of various sizes are used in reality, the conventional center line punching method is not practical when PS plates and films are to be used as the photosensitive materials 65 and 67.

The problem is even more serious in a case as that shown in FIG. 11 where a stopper 69 is fixed at a certain position in the inner surface 11. Fixing a stopper is suitable to automatic mounting of a photosensitive material. In FIG. 11, if the size of a photosensitive material is changed, center line punching is not possible any more. This is because the location of a center line of a photosensitive material is not the same any more. More precisely, even if a center line 71 of a photosensitive material 70 of a certain size is registered to a middle point between the two punching units 63 and 64, when a smaller photosensitive material 72 is mounted, a center line 73 of the photosensitive material 72 does not coincide with the middle point between the two punching units 63 and 64 since the punching units 63 and 64 are fixed.

In this manner, as long as the conventional structure as above is used, center line punching cannot deal with a change in the size of a photosensitive material. Although this problem does not occur with a photosensitive material feeding mechanism which is capable of accurately positioning a photosensitive material, use of such a large mechanism is not only unpractical due to a structural constraint on the cylindrical inner surface drum but also undesirable in terms of a cost. Against this background, a more realistic punching technique is strongly desired.

SUMMARY OF THE INVENTION

The present invention is directed to a punching apparatus to punch holes in a photosensitive material for use within a cylindrical inner surface scanner which includes a cylindrical inner surface drum having an inner surface and a central axis, the punching apparatus comprising: a plurality of punching unit for punching holes in the photosensitive material which is mounted on the inner surface; and moving means for moving the punching units within a predetermined range in a circumferential direction of the cylindrical inner surface drum in accordance with the size of the photosensitive material.

Accordingly, it is an object of the present invention to offer a punching apparatus for easily and accurately punching a hole in a photosensitive material at a predetermined position depending on the size of the photosensitive material.

These and other objects, features and advantages of the present invention will become apparent from the following detailed description of the present invention when taken in conjunction with the accompanying drawings.

DESCRIPTION OF THE PREFERRED EMBODIMENTS

A cylindrical inner surface scanner comprises a cylindrical inner surface drum, a photosensitive material (such as a film, a plate material and a photographic printing paper) which is mounted on the drum by vacuum suction force, a scanning head which moves along a central axis of the drum in the subscanning direction, a main scanning deflector which is disposed in the scanning head and which rotates about the central axis of the drum, and an imaging lens which is also disposed in the scanning head. In a cylindrical inner surface scanner, an optical beam modulated by an image signal is deflected by the deflector through the lens and swept upon the photosensitive material in a main scanning direction (i.e., the circumferential direction of the cylindrical inner surface drum) while moving the scanning head in the subscanning direction.

Figure 1:
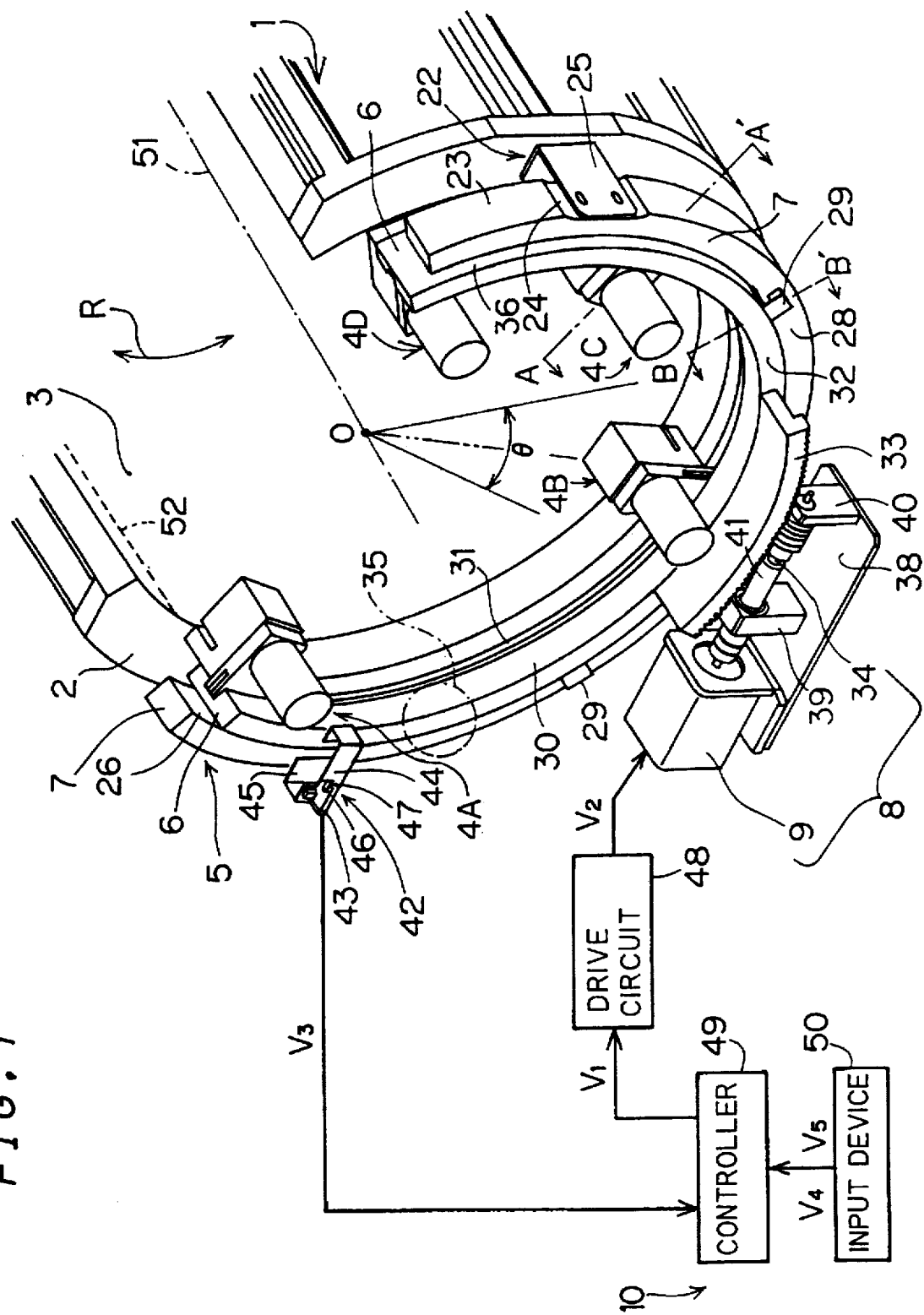
FIG. 1 is a perspective view of a moving unit which is attached to a rim of a cylindrical inner surface drum.

FIG. 1 is a perspective view of an end surface 2 of a cylindrical inner surface drum 1 and a neighboring structure of a cylindrical inner surface scanner according to a preferred embodiment of the present invention. In particular, FIG. 1 shows punching units 4A, 4B, 4C and 4D (which will be hereinafter referred to collectively as "punching unit 4") and a moving unit 5 for moving the punching units 4A to 4D. The punching unit 4 and the moving unit 5 form a punching apparatus. The punching unit 4 punches through a photosensitive material by punches which are movable in a vertical direction, thereby forming holes which receive pins of a platemaking apparatus or a printer in the photosensitive material. The moving unit 5 is an apparatus for moving the punching unit 4 in a circumferential direction R of an inner surface 3 of the cylindrical inner surface drum 1. In the present embodiment, the moving unit 5 is divided approximately into a moving part 6, a fixing part 7 and a drive force generating part 8 which includes a pulse motor 9, a key element, as a drive source. To control an amount Δx of movement (not shown in FIG. 1) of the moving unit 5, a control unit 10 is connected to the pulse motor 9. In the following, structures of the punching unit 4, moving unit 5 and control unit 10 will be described. As to other portions of the cylindrical inner surface scanner, since those portions are the same as described earlier under BACKGROUND OF THE INVENTION, detailed description will be simply omitted here.

Figure 2:
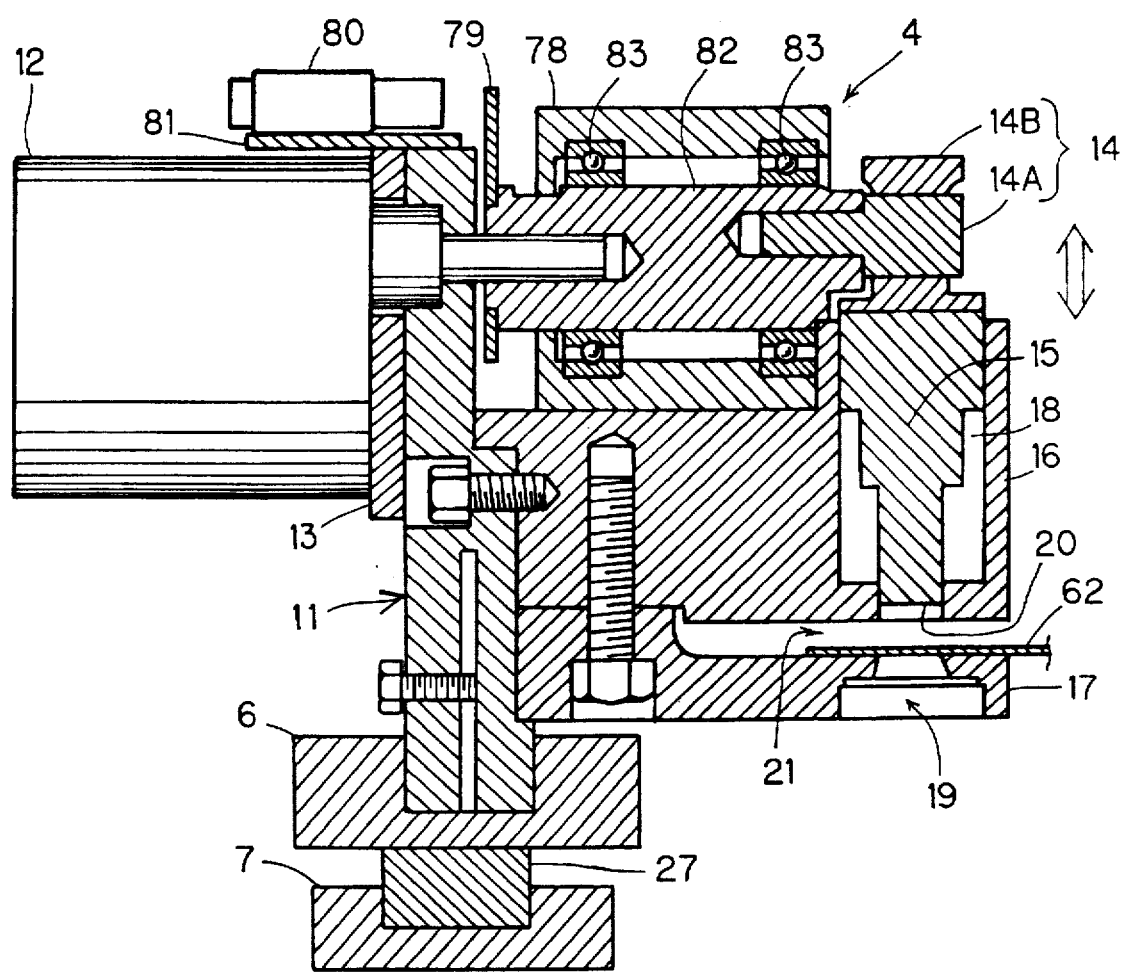
FIG. 2 is a cross sectional view along line A-A' of FIG. 1 of a punching unit.

FIG. 2 is an explanatory diagram showing a detailed vertical cross section of the punching unit 4C, which is exemplary of punching units 4A, 4B and 4D, taken along the line A-A' of FIG. 1. Key elements of the punching unit 4 are a motor 12, a cam mechanism 14, a punch 15 and a die 17. The motor 12 is mounted on a bracket 11 of the punching unit 4 through a motor bracket 13. A punching block 16 is bolted to the bracket 11. A rotation shaft of the motor 12 is engaged with a center portion of a shaft 82 which is axially supported by a bearing mechanism 78 which includes two bearings 83. Hence, the rotation shaft of the motor 12 and the shaft 82 axially coincide with each other. A shaft of an eccentric cam 14A of the cam mechanism 14 is fitted in the shaft 82 to be deviated from an axial center of the shaft 82. Thus, the shaft of the eccentric cam 14A is deviated from the rotation shaft of the motor 12. A follower 14B is linked to the eccentric cam 14A through an oval slit which is not shown in FIG. 2, whereby the cam mechanism 14 is formed. The punch 15 penetrates the punching block 16 in a through hole 18 of the punching block 16. The punch 15 is linked to the follower 14B at its upper end. The die 17 is bolted to the lower surface of the punching block 16. A dice hole 19 is formed in a tip portion of the die 17 so as to receive a tip portion 20 of the punch 15. A photosensitive material 62 is inserted into a space 21 between the punching block 16 and the die 17, and mounted on the die 17. For each of understanding, FIG. 2 shows an end of the photosensitive material 62 is placed on the die 17 although FIG. 2 is meant to be a cross sectional view of FIG. 1 taken along the line A-A'.

Having such a construction, the punching unit 4 operates in the following manner. When the motor 12 is driven by a motor driver not shown, rotation force of the motor 12 is transmitted to the eccentric cam 14A through the shaft 82, and the eccentric cam 14A rotates about the axial center of the shaft 82 at a position deviated from the axial center of the shaft 82. This eccentric rotation of the eccentric cam 14A moves the follower 14B in a vertical direction (i.e., the direction indicated by the thick arrow FIG. 2). The rotation force of the motor 12 is converted into driving force of a vertical direction by the eccentric cam 14A. Due to this driving force, the punch 15 moves in a vertical direction, i.e., from the free surface (i.e., a surface to be exposed) side of the photosensitive material 62 toward the mounted surface side of the photosensitive material 62, thereby punching through the end portion of the photosensitive material 62 which is placed on the die 17. The photosensitive material 62 is punched through in this manner, and cutouts of the punched photosensitive material 62 fall downward in the dice hole 19. The tip portion 20 of the punch 15 may be in the shape of a circular hole or a rectangular hole.

A reflection type optical sensor 80 is secured to the brackets 11 and 13 through an intervening support plate 81 to confirm vertical movement of the punch 15. A deformed disk plate 79 is fixed to an end of the shaft 82 in a faced relation with the bracket 11 in such a manner that the center of the deformed disk plate 79 is on the central shaft of the eccentric cam 14A. Hence, the deformed disk plate 79 rotates in synchronism with rotation of the eccentric cam 14A. Utilizing rotation of the deformed disk plate 79, the optical sensor 80 detects vertical movement of the punch 15. A detection signal generated by the optical sensor 80 indicates whether punching by the punch 15 is complete. The detection signal is outputted to a controller 49 of FIG. 1. In accordance with the detection signal, controller 49 controls feeding of the photosensitive material 62 onto and removing of the photosensitive material 62 from the inner surface 3 of the cylindrical inner surface drum 1.

Although FIG. 2 also shows how the punching unit 4 is attached to the moving unit 5 (FIG. 1), a description on this point will be later.

The punching unit 4 has such a structure as above and operates in the manner as described above. In the present embodiment, the punching unit 4 punches two holes in an end portion of the photosensitive material 62 (which extends beyond the end surface 2 of the cylindrical inner surface drum 1 onto the die 17 as shown in FIG. 1) by center line punching in accordance with the size of the photosensitive material 62. To bore two holes, only two out of the four punching units 4A, 4B, 4C and 4D, attached to moving unit 5, are driven to punch holes in photosensitive material 62.

The structure of the moving unit 5 is as shown in FIG. 1. The end surface 2 of the cylindrical inner surface drum 1 is in the shape of an arc. The fixing part 7 is also in the shape of an arc which is similar to the arc shape of the end surface 2, and is fixed to the end surface 2 through a bracket 22. More exactly, the L-shaped bracket 22 is bolted or welded to the end surface 2, and an outer surface 23 of the fixing part 7 is bolted or welded to a side plate 25 of the bracket 22 in a recess portion 24 which is formed in the outer surface 23. FIG. 1 shows only one such bracket 22 for clarity of illustration. In reality, however, a few more similar brackets are also attached to the end surface 2, whereby the fixing part 7 is secured to the end surface 2.

Since the configuration of the fixing part 7 is determined in accordance with the size of the end surface 2 of the circumferential direction R, the fixing part 7 is fixed along the end surface 2. Although not shown in FIG. 1, at four positions on the inner surface 26 side of the fixing part 7, column-like or cylindrical rollers 27 are mounted as described later (See FIGS. 2 and 4).

The moving part 6 has a similar arc configuration to the fixing part 7. The radius of curvature of the moving part 6 is smaller than that of the inner surface 26 of the fixing part 7 so that the moving part 6 fits the inner surface 26 of the fixing part 7. In a center area of an inner surface 30 of the moving part 6, a groove 31 is formed along the arc configuration of the moving part 6. The four punching units 4A to 4D are fitted in the groove 31 as described later in detail.

Figure 3:
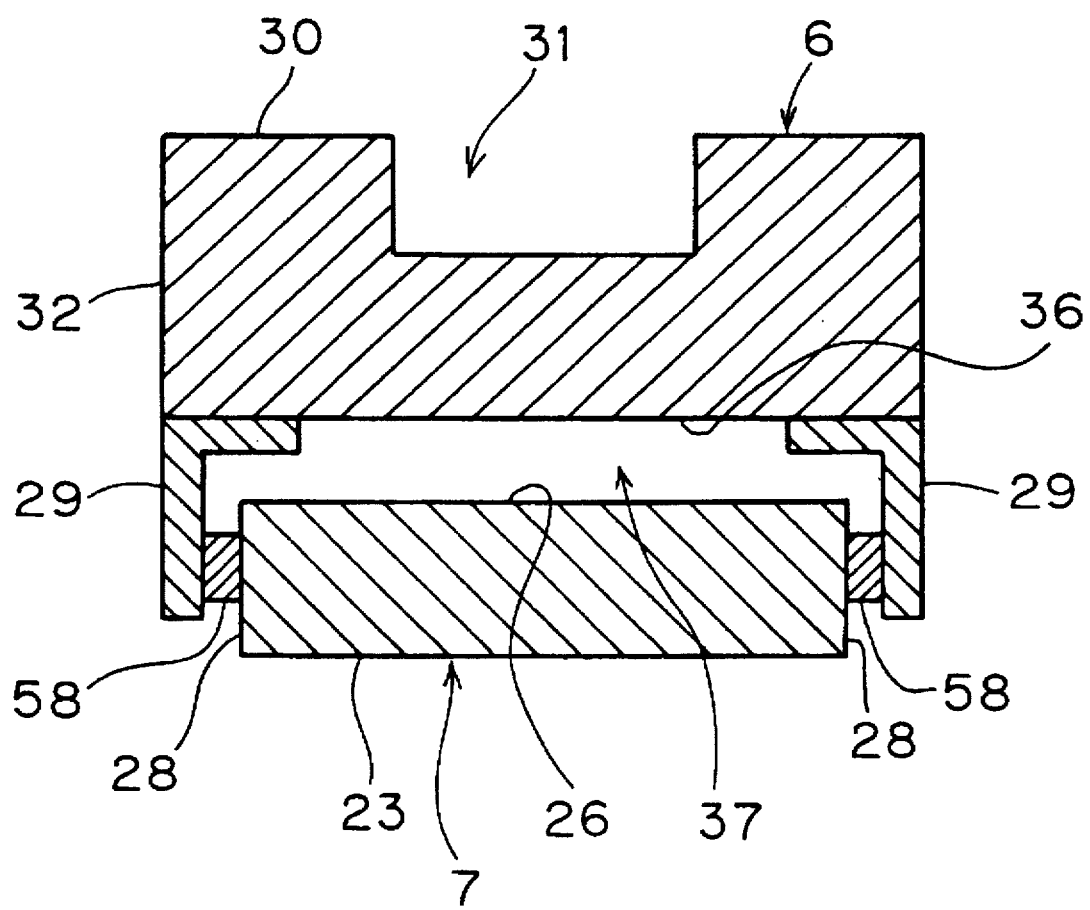
FIG. 3 is a cross sectional view along line B-B' of FIG. 1, showing a stopper plate as it is mounted.

L-shaped stopper plates 29 are attached to both margin areas of an outer surface 36 of the moving part 6 at four positions along the circumferential direction. For clarity of illustration, FIG. 1 shows only two stopper plates 29. For a detailed posture and structure of the stopper plates 29, FIG. 3 should be referred to (FIG. 3 is a cross section of FIG. 1 taken along the line B-B'). In FIG. 3, one of the side surface of each stopper plate 29 is fixed to each margin area of the outer surface 36 of the moving part 6, and the other surface of each stopper plate 29 fixedly carries a shoe 58. The shoes 58 are in direct contact with side surfaces 28 of the fixing part 7. Two stopper plates 29 are attached to the outer surface 36 of the moving part 6 in a manner that they sandwich the fixing part 7 at the side surfaces 28. Hence, due to the stopper plates 29, the moving part 6 smoothly slides along the inner surface 26 of the fixing part 7 without rattling sideways. A space 37 is created by the rollers 27 (FIG. 4) and effectively utilized in the present embodiment.

The moving part 6 is disposed or fits the inner surface 26 of the fixing part 7 so as to be rollably guided in the circumferential direction R by the rollers 27 and the stopper plates 29. A worm gear 33 is bolted or otherwise appropriately fixed to a central portion of a side surface 32 of the moving part 6 along the arc of the moving part 6 (FIG. 1). By engagement of the worm gear 33 and a worm 34, the moving part 6 is maintained in a halt as it is disposed or fitted on the inner surface 26.

Figure 4:
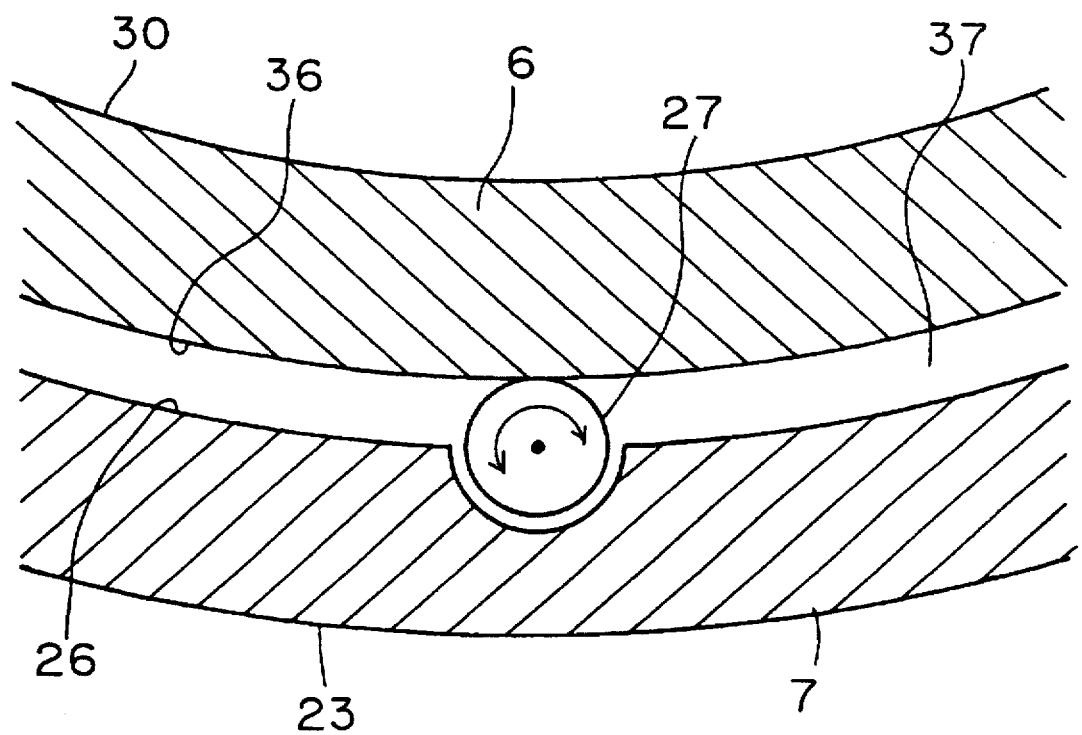
FIG. 4 is a cross sectional view showing a roller as it is mounted in phantom circle 35 of FIG. 1.

FIG. 4 is a cross section view of one of the rollers 27, showing phantom circle portion 35 of FIG. 1. In FIG. 4, the roller 27 is rotatably fitted in a groove which is formed in a portion of the inner surface 26 of the fixing part 7. The moving part 6 is located on the inner surface 26 side in such a manner than the outer surface 36 of the moving part 6 contacts the roller 27. Thus, the moving part 6 is in rollable contact with the roller 27. Utilizing the space 37 which is created between the moving part 6 and the fixing part 7, the stopper plates 29 are attached to the outer surface 36.

Figure 11:
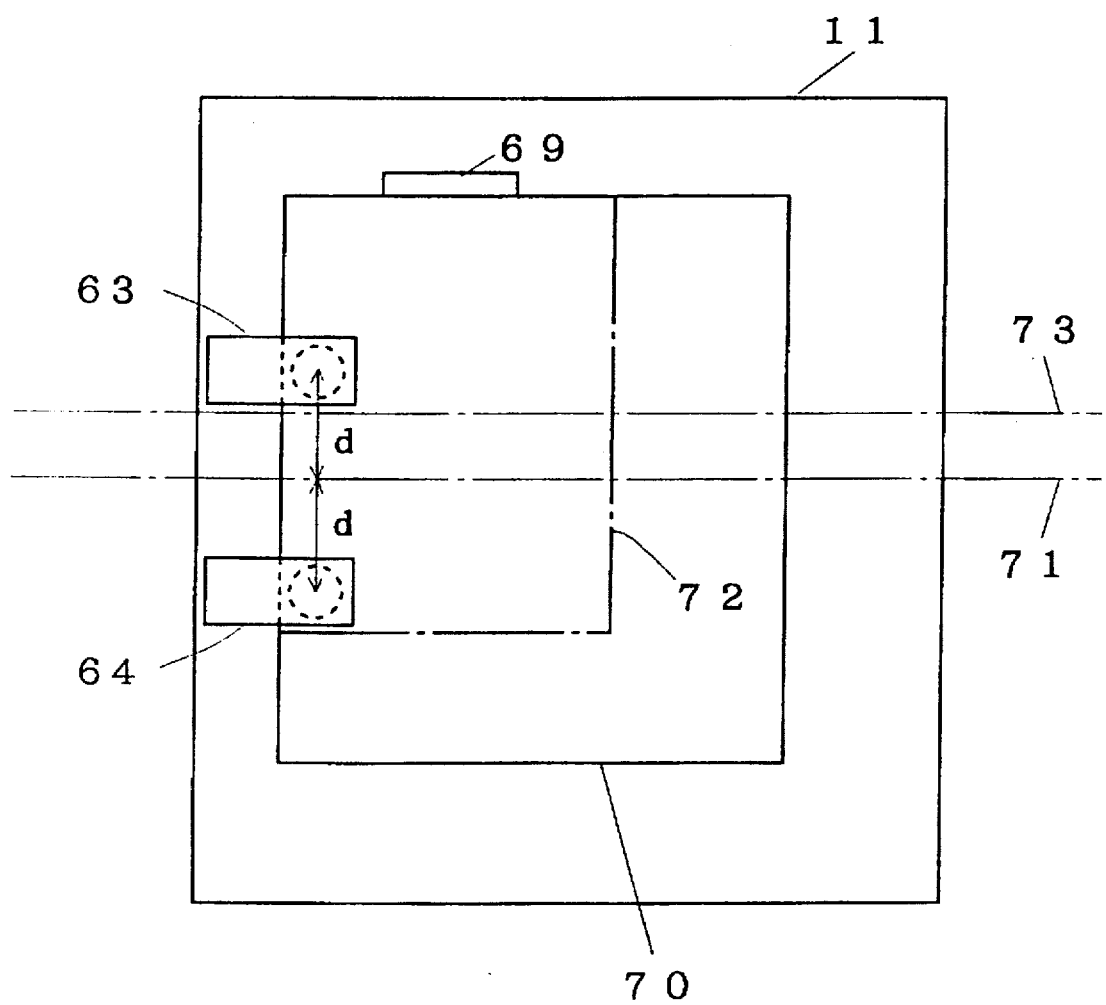

As described earlier, the four punching units 4A to 4D are fitted in the groove 31 and fixed to the moving part 6 (See FIG. 1). In the present embodiment, the mounting position of the respective punching units 4A to 4D are set as follows with respect to a photosensitive material feeding reference position 52 in the inner surface 3. As herein termed, the photosensitive material feeding reference position 52 is a position which corresponds to the mounting position of the stopper 69 shown in FIG. 11. First, the punching unit 4A is fitted into the moving part 6 at a position x1 mm away from the photosensitive material feeding reference position 52 in the circumferential direction R. The next punching unit 4B is fitted into the moving part 6 at a position x2 mm away from the photosensitive material feeding reference position 52 in the circumferential direction R. In a similar manner, the punching units 4C and 4D are fitted in at positions x3 mm and x4 mm away, respectively. The manner in which these punching units 4A to 4D are secured to the moving part 6 is as follows.

Figure 5:
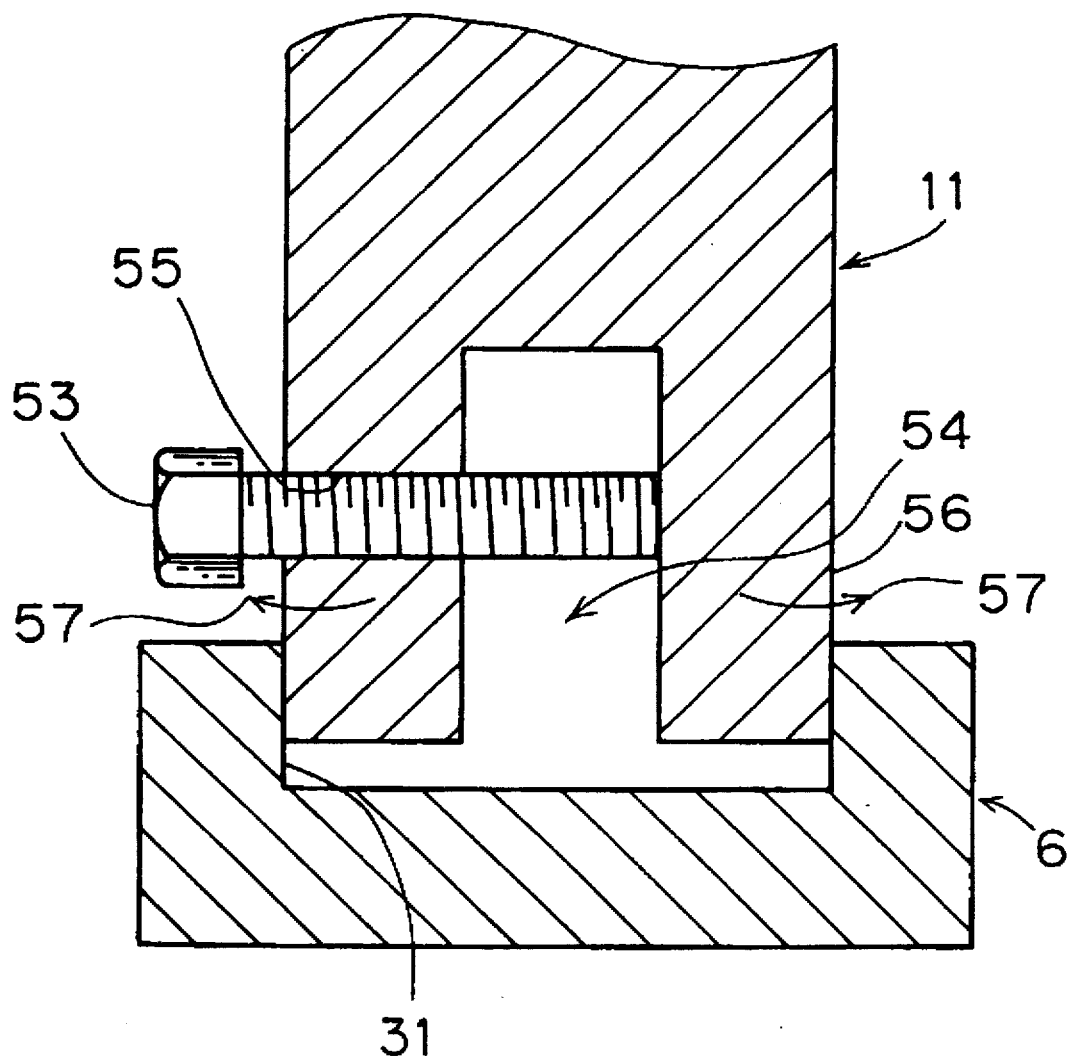
FIG. 5 is a cross sectional view showing the punching unit as it is attached to the moving unit.

FIG. 5 is a vertical cross sectional view showing the moving part 6 as it is linked to a tip portion 56 of the bracket 11 of the punching unit 4, which structure being similar to that of FIG. 2. The tip portion 56 of the bracket 11 includes a concave split 54 which is utilized to fit the tip portion 56 in the groove 31. That is, the tip portion 56 is inserted in the groove 31 and a bolt 53 is screwed in through a screw hole 55, thereby spreading out the split 54 in the direction of arrows 57 in FIG. 5. As a result, the tip portion 56 is fixed in the groove 31.

The drive force generating part 8 of FIG. 1 is generally formed by the pulse motor 9 and the worm 34. The pulse motor 9 and two support blocks 39 and 40 are fixed on a base plate 38 in such a manner that a rotation shaft of the pulse motor 9 is passed through a shaft 41 which is axially supported by the support block 39. One end of the worm 34 is axially supported by the support block 40 while the other end of the worm 34 is passed through the shaft 41. As described earlier, the worm 34 and the worm gear 33 are engaged with each other.

The control unit 10 controls the pulse motor 9. The control unit 10 comprises the controller 49, a key component, as well as a drive circuit 48, an input device 50 and an origin position detecting part 42. Although not shown in FIG. 1, the controller 49 includes a CPU part, a memory part and a counter part. The input device 50 is comprised of a key board, a mouse, a panel touch key and etc. In response to an instruction keyed in by an operator, the input device 50 outputs an input signal $V_4$ which designates the width of a photosensitive material to the CPU part of the controller 49. The memory part of the controller 49 stores first and second information respectively as a first and a second look-up tables as described later. The first information designates one of the punching units 4B, 4C or 4D to be selected with the punching unit 4A in order to punch two holes in the photosensitive material 62 in accordance with the width D of the photosensitive material 62. The first information also provides the distance d between the designated one of the punching units 4B and 4D and the punching unit 4A. As the first look-up table, the first information is stored in the memory part. The second information, which is stored in the memory part as the second look-up table, provides a pulse count which corresponds to the amount of movement $\Delta x$.

Figure 6:
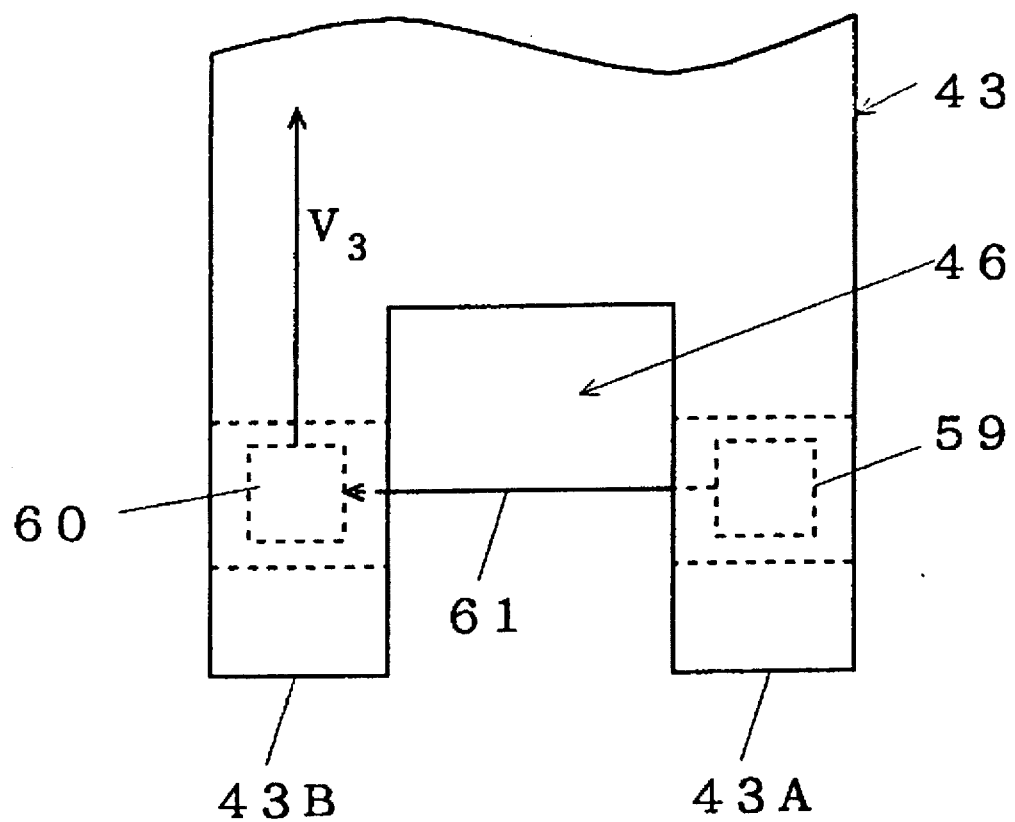
FIG. 6 is a plan view showing a structure of an original sensor where it includes a recess inside itself.

The origin position detecting part 42 is formed by an origin sensor 43, an L-shaped vane 44 and an L-shaped bracket 45. More exactly, the bracket 45 is bolted or welded at a side surface to the side surface 28 of the fixing part 7 at a position close to one end of the fixing part 7 of the photosensitive material feeding reference position 52 side as can be seen in FIG. 1. On the other side surface of the bracket 45 (which is parallel to the end surface 2), the origin sensor 43 is fixed. The tip portion of the origin sensor 43 includes a recess in the center. In one of projections 43A defining he recess 46, a light emitter 59 such as an LED and a halogen lamp is buried. In the other one of the projections 43B, an optical detector 60 such as a photo diode is buried in a facing relation with the light emitter 59 (FIG. 6, plan view). The vane 44 is fixed at one of its side surfaces to the side surface 32 of the moving part 6 at a position close to one end of the fixing part 7 of the photosensitive material feeding reference position 52 side (FIG. 1). The dimensions of the vane 44 are determined so that it is possible for a tip portion 47 which is formed in the other side surface of the vane 44 (which is parallel to the end surface 2) to move through the recess 46. In FIG. 1, the tip portion 47 is within the recess 46 to block light 61 (FIG. 6) from the light emitter 59 of the origin sensor 43. This state will be referred to as "origin position" as the controller 49 controls the pulse motor 9 in reference to this "origin position." The optical detector 60 of the origin sensor 43 outputs an origin position detection signal $V_3$ to the CPU part of the controller 49.

Receiving a control signal $V_t$ from the controller 49, the drive circuit 48 converts the control signal $V_1$ into a drive signal $V_2$ which is suitable to drive the pulse motor 9. The pulse motor 9 rotates in response to the drive signal $V_2$. By the worm 34 and the worm gear 33 which are engaged with each other, rotation force of the pulse motor 9 is converted into driving force which drives the moving part 6 in the circumferential direction R of the inner surface 3. As a result, the moving part 6 moves in the circumferential direction R along the inner surface 26 of the fixing part 7. Assuming that the amount of the movement of the moving part 26 is $\Delta x$, the four punching units 4A, 4B, 4C and 4D also move the amount $\Delta x$ in the circumferential direction R. Here, since the shoes 58 (FIG. 3) of the stopper plates 29 slide while holding the fixing part 7 at the side surfaces 28, the movement of the moving part 6 of the circumferential direction R is smooth without any rattling sideways. The moving direction (i.e., whether clockwise or counterclockwise with respect to the central axis 51 of the cylindrical inner surface drum 1) and the amount of movement $\Delta x$ of the moving part 6 are controlled or determined by the control signal $V_1$ from the controller 49. The amount of movement $\Delta x$ is controlled in a range of a sweep angle θ about a center point O of the arc of the end surface 2 on the central axis 51. In other words, the punching units 4A to 4D each cannot move beyond the angle θ (FIG. 1). The angle θ is set at 40° in this embodiment but is changed in accordance with the size of the photosensitive material 62.

Thus, the moving unit 5 is capable of moving the punching unit 4 within the range of the sweep angle θ in the circumferential direction R of the cylindrical inner surface drum 1. Defining a route or a path for rolling guide of the circumferential direction R of the moving part 6, the fixing part 7 functions as a guide member. Now, operations of the respective parts 6, 8 and 10 will be described in more detail.

First, the photosensitive material 62 of a predetermined size is inserted onto the inner surface 3 so that one side of the photosensitive material 62 is aligned to the photosensitive material feeding reference position 52. The photosensitive material 62 is set at such a position using a stopper (not shown) which is disposed along the photosensitive material feeding reference position 52 for direct contact with the photosensitive material 62. The photosensitive material 62 is inserted so that its one side hits against the stopper and so that an end of the photosensitive material 62 protrudes beyond the end surface 2 onto the die 17 of the punching unit 4 (FIG. 2). As described earlier, the photosensitive material 62 mounted in this manner is then exposed with a scanning light beam which is modulated by the image signal, followed by subsequent punching of holes.

An operator supplies the input signal $V_4$ which designates the width of the photosensitive material 62 to the CPU part of the controller 49 via the input device 50. Receiving the input signal $V_4$, the controller 49 (the CPU part) determines the amount of movement $\Delta x$ in accordance with the input signal $V\Delta$, reads a second information signal which provides the value θx as a pulse count from the second look-up table of the memory part, and stores the second information signal in a comparison circuit part of the CPU part as a reference signal. The amount of movement θx is determined in the following manner.

First, from the width D of the photosensitive material 62 supplied by the input signal $V_4$, the CPU part designates two of the punching units which are to be driven for punching of holes, one being the punching unit 4A and the other being determined in accordance with the first information stored in the first look-up table as described earlier. One the latter punching unit is designated, the CPU knows the distance d between the designated punching unit and the punching unit 4A from the first information stored in the first look-up table. The CPU then calculates the amount of movement $\Delta x$ from the equation $\Delta x=(D-d)/2-x1$ where x1 expresses a distance between the punching unit 4A and the photosensitive material feeding reference position 52 of when the moving part 6 is at the origin position. With the amount of movement $\Delta x$ calculated, the CPU can now determine the count number which corresponds to the amount of movement Δx in reference to the second information which is stored in the second look-up table.

The operator then enters an instruction signal $V_5$ which calls for a start of positional adjustment of the punching units 4A, 4B, 4C and 4D. In response to the instruction signal $V_5$, the controller 49 outputs the pulse control signal $V_1$, to the pulse motor 9 via the drive circuit 48. At the start of the positional adjustment, the moving part 6 rests still at such a position which causes the vane 44 of the origin position detecting part 42 is located above the origin sensor 43. The vane 44 passes through the recess 46 of the origin sensor 43 as the moving part 6 driven by the pulse motor 9 starts moving in the circumferential direction R in a counterclockwise direction (as viewed from the outside of the end surface 2 toward the end surface 2). During this, the light 61 from the light emitter 59 of the origin sensor 43 is blocked, which emerges as a change in the origin position detection signal $V_3$. The controller 49 detects the change to sense arrival of the moving part 6 to the origin position. At the same time, the controller 49 activates the counter part to start counting pulses of the control signal $v_1$. An output of the counter part is supplied to an input terminal of the comparison circuit part of the controller 49. The comparison circuit part compares a count registered by the counter part with the count expressed by the reference signal to detect whether the two counts coincide with each other.

Figure 7:
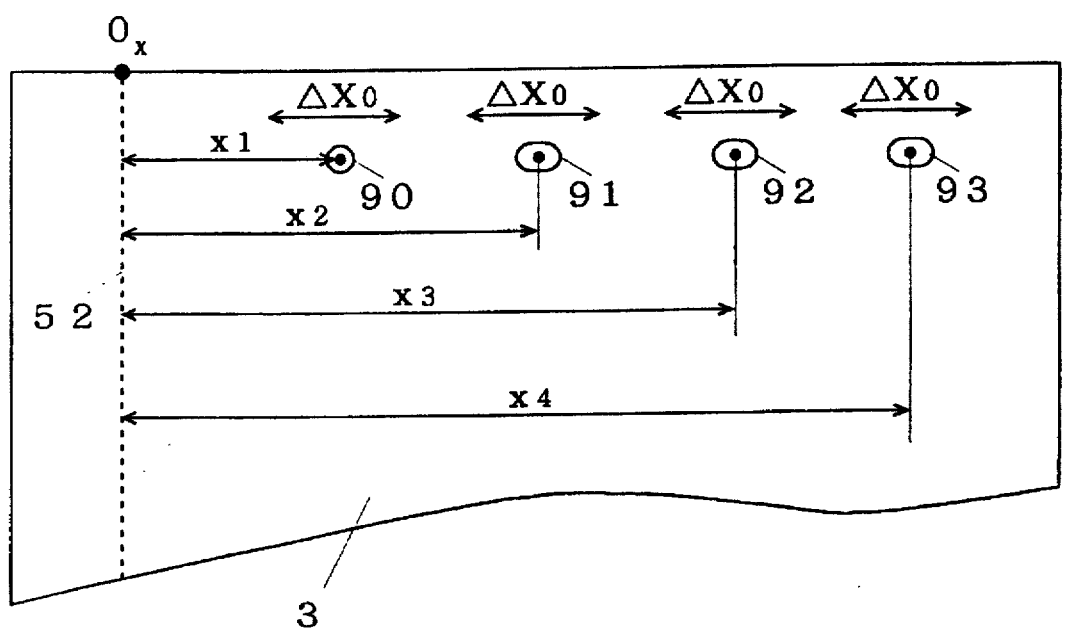
FIG. 7 is a plan view showing a movable range of each punching unit.

The pulse motor 9 rotates in shaft in accordance with the control signal $V_1$ or the drive signal $V_2$. As a result, the moving part 6 and hence the four punching units 4A to 4D move in the circumferential direction R in a clockwise or counterclockwise direction in accordance with the level of the control signal $V_1$. FIG. 7 is a schematic plan view showing a movable range $\Delta X_0 (\Delta X_0 \geq \Delta x)$ of each of the punching units 4A, 4B, 4C and 4D. In FIG. 7, points which are x1 mm, x2 mm, x3 mm and x4 mm away from a reference point $0_x$ which denotes the photosensitive material feeding reference position 52 respectively express positions at which the centers of the punching units 4A, 4B, 4C and 4D are located when the moving part 6 arrives at the origin position. For better understanding, FIG. 7 also shows holes 90 to 93 which are punched in at the centers of the punching units 4A to 4D.

Upon detection of coincidence of the two counts by the comparison circuit part of the controller 49, the controller 49 stops outputting the control signal $V_1$, which in turn forces the moving part 6 into a halt. At the stage, the two of the punching units 4A, 4B, 4C and 4D designated by the CPU part (one of the two is the punching unit 4A) are at the positions in the circumferential direction R where the photosensitive material 62 mounted on the inner surface 3 is to be punched through. Following this, the two punching units 4 designated in accordance with the width D of the photosensitive material 62 (one of the two is always the punching unit 4A) are driven, whereby two holes are punched equidistant from each other accurately at the predetermined positions in the end portion of the photosensitive material 62.

Figure 8:
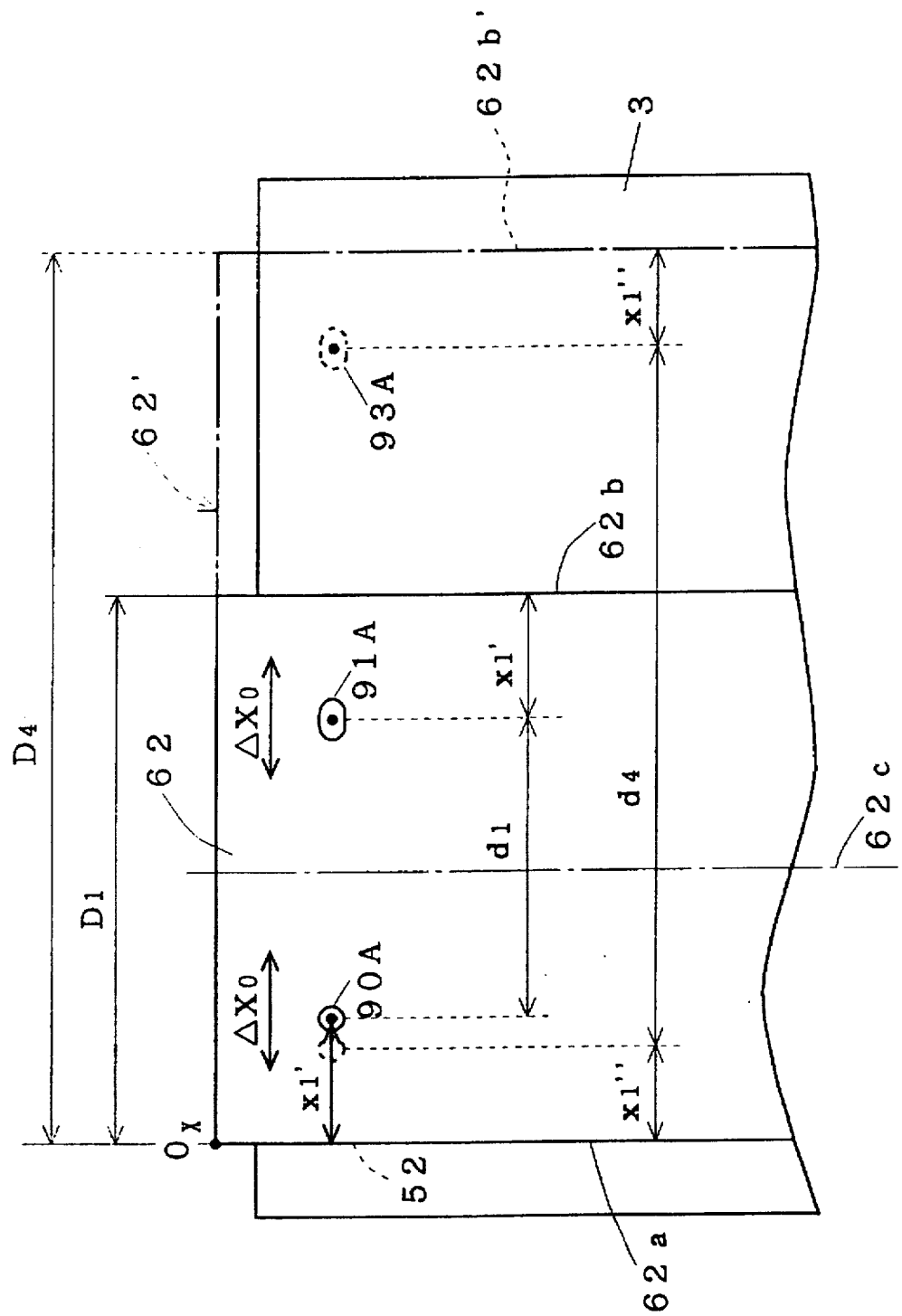
FIG. 8 is a plan view of punching of holes using punching units dependent on the size of a photosensitive material.

An example of this is illustrated in the plan view of FIG. 8. In FIG. 8, the photosensitive material 62 has a width D1, and when mounted, has its one side 62b terminating between the punching units 4B and 4C which are at their respective origin positions. (The other side 62a of the photosensitive material 62 is at the photosensitive material feeding reference position 52). Two holes are to be punched in the photosensitive material 62 by center line punching. In this case, to form two such holes, the punching units 4A and 4B are designated by the CPU part and driven. By punching through the photosensitive material 62 at positions respectively a distance x1' away from the sides 62a and 62b toward the center line 62c of the photosensitive material 62, it is possible to form two holes equidistant from each other. To realize this, the controller 49 adjusts the positions of the punching units 4A and 4B within the movable range $\Delta X_0$ in the manner previously described so that the tip portions 20 of the punches 15 of the punching units 4A and 4B are registered with the positions which are respectively away from the sides 62a and 62b by the distance x1' toward the center line 62d. The distance d1 between the punching units 4A and 4B is d1=x2−x1 and therefore the distance x1'. Depending on the sign of the amount of movement Δx1 (i.e., whether the amount of movement Δx1 has a positive value or a negative value), whether to move the punching units 4A and 4B to the right side or to the left side is determined. Following this, the operator drives the punching units 4A and 4B and punch in two holes 90A and 91A in the photosensitive material 62. More precisely, again, the operator supplies an instruction signal for driving the motors 12 which are associated with the punching units 4A and 4B to the controller 49 via the input device 50, and the controller 49 controls the respective motors 12.

Another example is in the case of a photosensitive material 62' which is indicated by the dashed-and-dotted line in FIG. 8. The photosensitive material 62' has a wider width D4, and when mounted, has its one side 62b' terminating beyond the punching unit 4D which is in its origin position. In this case, the outer-most punching units 4A and 4D are driven and two holes 90A and 93A are punched in. Since a distance d4 between the two punching units 4A and 4D is d4=x4−x1 and a distance x1" is x1"=(D4−d4)/2, an amount of movement Δx4 is Δx4=x1"−x1. From the sign of the value Δx4, whether to move the moving part 6 in a clockwise or a counterclockwise direction is known.

Following this, the detection signal is supplied from the optical sensor 80 to the controller 49 and the controller 49 confirms that the punching is complete. The photosensitive material 62 now punched through is then removed from the inner surface 3, and another photosensitive material is inserted and mounted ont the inner surface 3. At this stage, the pulse motor 9 is driven to move the moving part 6 in a such a manner that the vane 44 is again located above the origin sensor 43. The operator supplies the input signal $V_4$ which designates the width of the new photosensitive material to the controller 49 via the input device 50, and the processes as described above are performed. As a result, the punching units 4A to 4D each move the amount Δx which corresponds to the width of the new photosensitive material, and two punching units designated for the new photosensitive material punch holes in at optimum positions.

The structure described heretofore creates several advantages. First, it is possible to move the punching unit 4 within the range of the sweep angle θ in the circumferential direction R in accordance with the width of the photosensitive material 62, which in turn makes it possible to punch holes in the photosensitive material 62 at any desired positions regardless of the width of the photosensitive material 62. In the present embodiment, it is particularly advantageous that since pulse counts corresponding to widths of various photosensitive materials 62 are stored in advance in the controller 49 as the second look-up table, an operator only has to supply the input signal $V_4$ which designates the width of a photosensitive material to the controller 49 before punching. The subsequent positional adjustment of the punching unit 4 in the circumferential direction R is accurately and automatically performed because the controller 49 automatically controls the amount Δx by which the moving unit 5 is to move. As a further advantage, being performed in accordance with pulse counts in reference to the output signal of the origin sensor 43, the control of the respective units is precise. This greatly contributes to an improved accuracy of the positional adjustment of the punching unit 4.

Still further, in the present embodiment, since the moving unit 5 is assembled externally to the cylindrical inner surface drum 1 and attached to the end surface 2 as one integral unit externally to the cylindrical inner surface drum 1, the moving unit 5 is assembled and attached in an easy manner. The moving unit 5 has a simple structure generally comprised of the fixing part 7 and the moving part 6 and is not large, which allows even easier assembling. Thus, the moving unit 5 is preferable in terms of a manufacturing cost as well.

Even further, it is possible to move a plurality of the punching units in the circumferential direction R all at the same time at the same accuracy in the present embodiment since the punching units are fitted in the groove 31 of the moving part 6. Because of this, it is possible to adjust the positions of the plurality of the punching units all at one time. In this regard, the present embodiment greatly contributes to an improvement of the efficiency of the positional adjustment of the punching unit 4. In addition, in the present embodiment, the so-called "rolling guide" of the moving part 6 by means of the rollers 27 and the stopper plates 29 makes it possible for both the moving part 6 and the punching unit 4 to smoothly move along the inner surface of the fixing part 7 without rattling.

Figure 9:
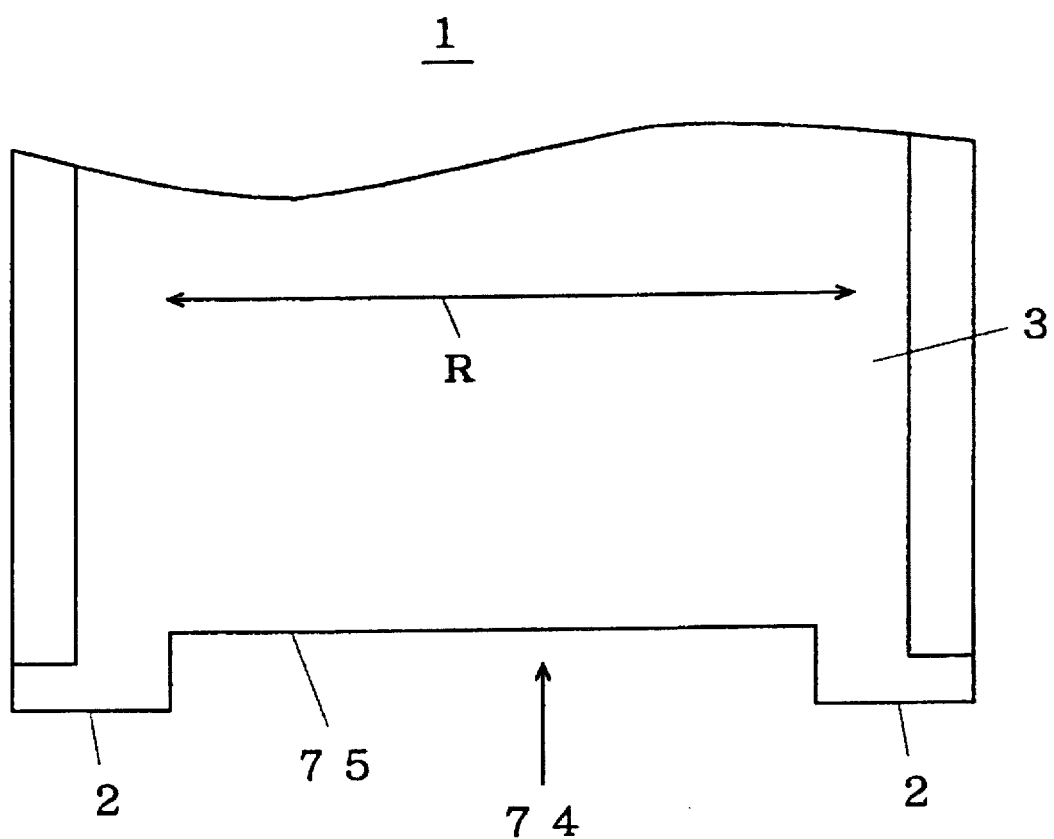
FIG. 9 is a plan view of a modification of the present invention.
Figure 10:
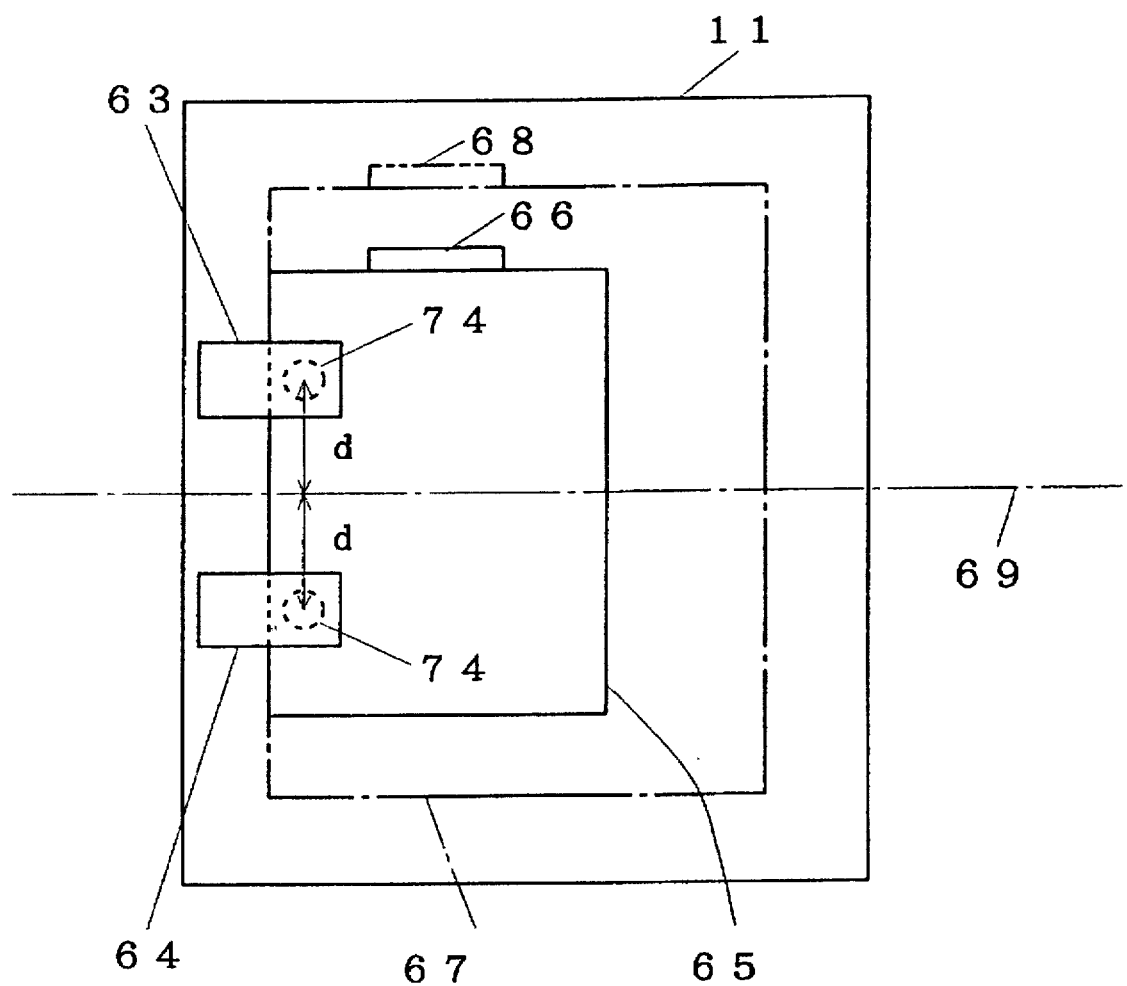
FIGS. 10 and 11 are explanatory Prior Art diagrams showing a problem in a conventional center line punching technique.

Although the moving unit 5 is disposed in the end surface 2 in the embodiment described above, a unit which corresponds to the moving unit 5 may be disposed inside the cylindrical inner surface drum 1. In this case, however, the end surface 2 of the cylindrical inner surface drum 1 must be locally removed to form a recess 74 so as to attach the unit which corresponds to the moving unit 5 to a surface (an end portion) 75 of the recess 74 as shown in FIG. 9. There is no need to place the photosensitive material 62 beyond the end surface 2 of the cylindrical inner surface drum 1.

The moving unit 5 is not limited to the structure of FIG. 1. Instead, a guide rail may be formed in the end surface 2 in the circumferential direction R and the split 54 of the punching unit 4 (FIG. 5) is fitted in the guide rail so that the punching unit 4 can move along the guide rail in the circumferential direction R.

The punching unit 4 may not be mechanically moved in the circumferential direction R by means of the pulse motor 9 as shown in FIG. 1, but instead may be manually moved in the circumferential direction R and fixed at a desired position.

Further, although the four punching units 4A, 4B, 4C and 4D are controlled at the same time in the embodiment of FIG. 1, the punching units may be independently controlled. To this end, units each corresponding to the moving unit 5 are independently attached to the end surface 2 for the respective punching units are driven independently. In this case, only those which are to move among the punching units 4A, 4B, 4C and 4D are moved and adjusted for their positions.

In the embodiment above, the controller 49 controls the pulse motor 9 in accordance with a pulse count. However, the controller 49 may control the pulse motor 9 in accordance with a time elapsed from the time of the origin position instead. To this end, the controller 49 must include a timer for measuring the elapsed time instead of the counter. A driving source may be a motor such as a DC motor which continuously rotates substantially at the same speed.

While the invention has been described in detail, the foregoing description is in all aspects illustrative and not restrictive. It is understood that numerous other modifications and variations can be devised without departing from the scope of the invention.

We claim:

1. A punching apparatus to punch holes in a photosensitive material for use within a cylindrical inner surface scanner, which includes a cylindrical inner surface drum having an inner surface and a central axis, said punching apparatus comprising:

a plurality of punching units for punching holes in said photosensitive material which is mounted on said inner surface; and moving means for moving said plurality of punching units within a predetermined range in a circumferential direction of said cylindrical inner surface drum, said moving means moving all of or a portion of said plurality of punching units so that at least two of said punching units perform punching at punching positions which are determined on the basis of a size of said photosensitive material.

2. The punching apparatus of claim 1, wherein said moving means is attached to an end surface of said cylindrical inner surface drum.

3. The punching apparatus of claims 1 or 2, wherein said moving means comprises a moving unit which includes:

a fixing part fixed to said end surface of said cylindrical inner surface drum;

a moving part movable along said fixing part, said moving part connected to said plurality of punching units; and a drive force generating part for driving said moving part.

4. The punching apparatus of any one of claims 1 or 2, further comprising control means for determining an amount of movement of said plurality of punching units for punching holes at punching positions which are determined by size of said photosensitive material and for generating a control signal which expresses the amount of movement, wherein said moving means moves said punching units by said control signal.

5. The punching apparatus of claim 4, wherein said control means determines two of said plurality of punching units to be driven for punching of said holes said size of said photosensitive material.

6. The punching apparatus of claim 1 or 2, wherein said moving means comprises a plurality of moving units, which move said plurality of punching units, each of said moving units including:

a fixing part fixed to said end surface of said cylindrical inner surface drum;

a moving part slidably movable along said fixing part, said moving part connected to one of said punching units; and a drive force generating part for driving said moving part.

7. The punching apparatus of claim 6, further comprising control means which determines which two of said plurality of punching units are to be driven for punching said holes, a determination being determined by said size of said photosensitive material.

8. The punching apparatus of claim 7, wherein said control means further determines an amount of movement of said punching units for punching holes at punching positions which are determined by the size of said photosensitive material and for generating a control signal which expresses the amount of movement, wherein said moving means moves said two punching units by said control signal.

9. The punching apparatus of claim 3, further comprising a pair of shoes fixed to said moving part to contact with and sandwich said fixing part.

10. The punching apparatus of claim 3, further comprising a roller rotatably provided between said moving part and said fixing part.

11. The punching apparatus of claim 3, further comprising control means for determining an amount of movement of said plurality of punching units for punching holes at punching positions which are determined by the size of said photosensitive material and for generating a control signal which expresses the amount of movement, wherein said moving means moves said punching units by said control signal.

12. The punching apparatus of claim 11, wherein said control means determines two of said plurality of punching units to be driven for punching of said holes by the size of said photosensitive material.

13. The punching apparatus of claim 6, further comprising a pair of shoes fixed to said moving part to contact with and sandwich said fixing part.

14. The punching apparatus of claim 6, further comprising a roller rotatably provided between said moving part and said fixing part.

15. A punching apparatus to punch holes in a photosensitive material for use within a cylindrical inner surface scanner, which includes a cylindrical inner surface drum having an inner surface and a central axis, said punching apparatus comprising:

a plurality of punching units for punching holes in said photosensitive material which is mounted on said inner surface; and moving means for moving said plurality of punching units within a predetermined range in a circumferential direction of said cylindrical inner surface drum, said moving means moving all of or one part of said plurality of punching units so that at least two of said punching units perform punching at punching positions which are determined on the basis of a size of said photosensitive material.

* * * * *